(12) United States Patent
Lee et al.

(10) Patent No.: US 7,095,070 B2
(45) Date of Patent: Aug. 22, 2006

(54) METHOD FOR FABRICATING BI THIN FILM AND DEVICE USING THE SAME

(75) Inventors: Woo Young Lee, Seoul (KR); Kyung Ho Shin, Seoul (KR); Suk Hee Han, Seoul (KR); Joon Yeon Chang, Seoul (KR); Hi Jung Kim, Seoul (KR); Dal Young Kim, Seoul (KR); Kwan Hyi Lee, Seoul (KR); Kyoung Il Lee, Gyunggi-Do (KR); Min Hong Jeun, Gyunggi-Do (KR)

(73) Assignee: Korea Institute of Science and Technology, Seoul (KR)

( * ) Notice: Subject to any disclaimer, the term of this patent is extended or adjusted under 35 U.S.C. 154(b) by 147 days.

(21) Appl. No.: 10/798,447

(22) Filed: Mar. 12, 2004

(65) Prior Publication Data

US 2004/0179309 A1    Sep. 16, 2004

(30) Foreign Application Priority Data

Mar. 14, 2003   (KR) .................. 10-2003-0016173

(51) Int. Cl.
*H01L 31/062*    (2006.01)
*H01L 21/00*    (2006.01)

(52) U.S. Cl. ............... 257/295; 257/421; 257/426; 438/3; 438/308

(58) Field of Classification Search ............. 438/3, 438/48, 308; 257/295, 421, 422, 423, 424, 257/425, 426

See application file for complete search history.

(56) References Cited

U.S. PATENT DOCUMENTS 6,187,165 B1   2/2001   Chien et al.
6,358,392 B1 *   3/2002   Yang et al. .................. 205/205
6,919,213 B1 *   7/2005   Flatte et al. .................... 438/3

FOREIGN PATENT DOCUMENTS

WO    WO 00/37715    6/2000

OTHER PUBLICATIONS

Gang Xiao et al., "Very Large Magnetoresistance in Electrodeposited Single-Crystal Bi Thin Films (Invited)," Journal of Applied Physics, vol. 87, No. 9, May 1, 2000, pp. 4659.
Liu et al., "Structural and Magneto-Transport Properties of Electrodeposited Bismuth Nanowires," Applied Physics Letters, American Institute of Physics, New York, vol. 73, No. 10, Sep. 7, 1998, pp. 1436-1438.
Cho et al., "Large Magnetoresistance in Post-Annealed Polycrystalline and Epitaxial Bi Thin Films," J. of Magnetism and Magnetic Materials, Elsevier Science B.V., Netherlands, vol. 239, Feb. 2002, pp. 201-203.
European Search Report dated Aug. 10, 2004.

* cited by examiner

*Primary Examiner*—Kevin M. Picardat
(74) *Attorney, Agent, or Firm*—Morrison & Foerster LLP

(57) ABSTRACT

In a method for fabricating a Bi thin film having a great MR (magnetoresistance) at room temperature and a method for fabricating a spintronics device using the same, the Bi thin film is fabricated by an electrodepostiting method and a sputtering method and has very great MR characteristics at room temperature, and it can be applied to various spintronics devices.

14 Claims, 5 Drawing Sheets

METHOD FOR FABRICATING BI THIN FILM AND DEVICE USING THE SAME

BACKGROUND OF THE INVENTION

1. Field of the Invention

The present invention relates to a method for fabricating a Bi thin film, and in particular to a Bi thin film fabricated by an electrodepositing method or a sputtering method and a spin electronic device using the same.

2. Description of the Related Art

Because of inherent physical characteristics and application possibility as spintronics device, researches on MR (magnetoresistance) effects of a thin film and a multilayer made of magnetic metal have been actively performed. In the MR effects, there is an AMR (anisotropic MR) effect shown in ferromagnetic metal and metal alloy. The AMR effect depending on an angle between a magnetization (M) direction of the ferromagnetic metal and a current flow direction in the metal has a comparatively low MR ratio less than 2%. In spite of the low MR ratio, the AMR effect was used widely for a reproducing head of a hard disk, etc. and a low-field sensor several years ago. In particular, the reproducing head uses a GMR (giant magnetoresistance) phenomenon discovered in a laminated structure of ferromagnetic metal and paramagnetic metal developed in the year 1988.

The GMR phenomenon was discovered in a Fe/Cr multi thin film for the first time, because it was possible to fabricate a multi thin film having uniform nano thickness (not greater than 1 nm) according to development of UHV (ultrahigh vacuum) techniques, the GMR phenomenon could occur. Because the GMR effect has a MR ratio several tens percent greater than that of the AMR effect, researches on the GMR effect have been actively performed all over the world. However, in the multi layer structure in which resistance is varied according to relative magnetization direction of an adjacent magnetic layer, because of very strong magnetic coupling between magnetic layers, very strong applied magnetic field is required, and accordingly it is difficult to apply the GMR phenomenon.

After developing a spin-valve structure in which magnetization of each magnetic layer occurs independently by inserting a non-magnetic metal layer such as Cu, etc. between two ferromagnetic metal layers, the GMR phenomenon can be applied to a device actually. In case of the spin-valve structure, because an inserted non-magnetic metal layer can have a sufficient thickness, magnetic coupling of adjacent two ferromagnetic metal layers can be eliminated, and accordingly it can act sensitively to very little external magnetic field of several $0e$. Besides, there is an colossal MR, CMR effect occurred in manganite (La—Ca—Mn—O), etc., because it requires very great applied magnetic field and occurs only in a low temperature region, there are difficulties in applying it to a magnetic field sensor, etc.

There is a general MR (ordinary MR, OMR) effect occurred in all metal and metal alloy groups (herein, a MR (magnetoresistance) ratio of each metal is different). The general MR is regarded as the simplest among the MR effects, it occurs by variation of a moving path (according to Lorentz force affected by an external magnetic field) of a carrier in a substance. In case of general metal such as Cu and Au, etc., an OMR ratio is very little almost to be ignored. However, in some substances such as semimeatalic Bi, a MR effect is greater than a certain GMR effect due to electromagnetic characteristics of a substance.

Bi has a low carrier concentration and a very little effective mass as 1/100 of general metal. It has been reported bulk-shaped single crystal Bi has a very long mean free path not less than 100 μm. As mentioned-above, because of unique electric characteristics thereof, lots of researches have been performed on transport property of Bi, and it has been known Bi has good OMR characteristics. Because characteristics of Bi can be varied greatly according to a crystalline structure thereof, a crystalline structure of Bi is the most important factor in occurring of the OMR effect. With inherent characteristics of Bi, in applying of Bi to a device, it is essential to fabricate a Bi thin film of good quality not having a bulk shape and having good characteristics. However, it has been known it is difficult to fabricate a Bi thin film of good quality. Recently, fabricating a Bi thin film by performing MBE (molecular beam epitaxy) on a $BaF_2$ substrate has been reported. In the MBE, a depositing speed is within a range of 0.1–1 nm/min, it is very slow in comparison with 10–100 nm/min in a sputtering method. Because the $BaF_2$ substrate has a lattice parameter crystalline structure similar to that of Bi, epitaxy growing is possible on the $BaF_2$ substrate, and accordingly it is selected as a substrate for growing a Bi thin film. However, the thin film is good only in the low temperature characteristics aspect, the thin film according to the conventional art is not practical in the film growing speed and production cost aspects, etc.

SUMMARY OF THE INVENTION

In order to solve the above-mentioned problem, it is an object of the present invention to provide a method for fabricating a Bi thin film having great MR (magnetoresistance) at room temperature.

In addition, it is another object of the present invention to provide various spin electric devices using a MR (magnetoresistance) phenomenon at room temperature.

Hereinafter, objects and characteristics of the present invention will be described in more detail.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

In order to achieve the above-mentioned objects, a method for fabricating Bi having MR (magnetoresistance) characteristics as a thin film having an expected thickness will be described.

In the present invention, a method for fabricating a Bi thin film by electrodepositing a Bi solution onto a substrate by applying a current within 1–100 mA to the Bi solution at room temperature will be described. In addition, a method for fabricating a Bi thin film by forming a Bi thin film onto a substrate by sputtering in a vacuumized will be described. In the present invention, a Bi thin film can be fabricated as a depositing ratio within 0.1–10 μm/min.

A Bi thin film has a very fast film growth speed in the electrodepositing method, and a thickness of a Bi thin film can be controlled easily in the sputtering method. In case of Bi, because characteristics thereof are varied sensitively according to a crystalline structure, a heat processing process is performed in order to obtain a crystalline structure of a Bi thin film having better characteristics.

In the Bi thin film fabricated by the above-mentioned process, a minute patterning process can be easily performed, a device having an expected structure can be implemented, in particular, application to a spin electronic device such as a magnetic field sensor and a spin injected device, etc. can be performed.

Herein, the present invention will be described in more detail through characteristics evaluation of a Bi thin film according to embodiments of the present invention.

Figure 1:
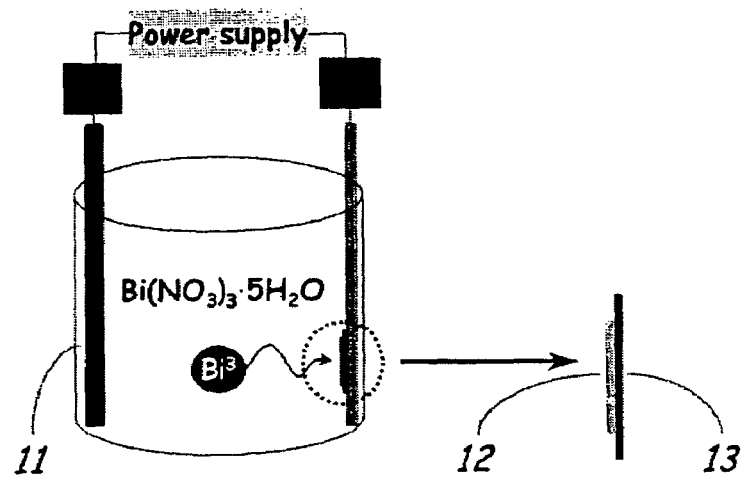
FIG. 1 shows fabricating a Bi thin film by an electrodepositing method.

First, a Bi thin film is fabricated by electrodepositing. FIG. 1 shows fabricating a Bi thin film by using electrodeposition. A substrate 11 is fabricated by cutting a 3 inch silicon wafer so as to be a chip having a size of 11.5 mm×11.5 mm. A Pt underlayer (not shown) usable as a working electrode is deposited onto the substrate so as to have a thickness of 100 Å by using a DC magnetron sputtering system, and C (carbon) is used for a counter electrode 13. A Bi solution $(Bi(NO_3)_3 \cdot 5H_2O)$ obtained by adding Bi (bismuth nitrate pentahydrate), potassium hydroxide, L(+)-tartaric acid, glycerol and nitric acid into ultra pure water is used as a solution. Electrodepositing is performed at room temperature, and an area of a Bi thin film 12 is 5 mm×5 mm. Herein, electrodepositing is performed by applying 10 mA current and maintaining a deposition ratio of 0.44 μm/min. In addition, a stirrer is used in order to perform electrodeposition uniformly.

In the present invention, a silicon substrate is used. However, the present invention is not limited by that, and modification of a Bi solution is also possible.

In addition, a Bi thin film is fabricated by sputtering. In fabrication of a Bi thin film by a sputtering system, the same substrate with that used in the electrodepositing system is used. In case of using a RF magnetron sputtering system, initial degree of vacuum is maintained so as to be not greater than $5 \times 10^{-8}$ Torr, degree of vacuum in deposition is maintained as 2 mTorr. In addition, in order to maintain high surface smoothness, a distance between a target and a substrate is 10 cm. A deposition speed is maintained as 1.0 μm/min, and a size of a deposited Bi thin film is 3 mm×6 mm.

The fabricated Bi thin film is heat-processed in vacuum. In consideration of a relatively low melting point (271.4° C.), it is performed for several hours within a temperature range of 250–270° C. In order to make a single crystal, it is preferable to perform the process at a temperature lower than the melting point for a long time, in the present invention, heat processing is performed for 6–24 hours or more than that.

Electric characteristics and magnetoresistance characteristics of the fabricated Bi thin film are measured by using a general 4-point probe method. In measuring, an external magnetic field up to 9 T is applied, and a temperature is within 4 K~300 K. In addition, in order to know resistance variation according to a direction of applied magnetic field, current and direction of magnetic field are varied such as perpendicular, transverse and longitudinal directions. In order to analyze surface and inner crystalline structure of the Bi thin film, XRD (x-ray diffraction), SEM (scanning electron microscope) and AFM (atomic force microscope) are used.

Figure 2:
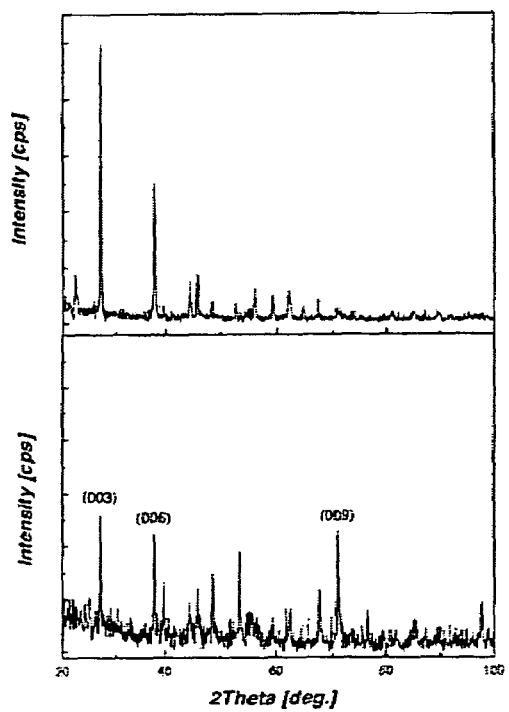
FIG. 2 shows x-ray diffraction pattern before/after performing heat processing on an electrodeposited-Bi thin film.

FIG. 2 shows x-ray diffraction pattern before/after performing heat processing on an electrodeposited Bi thin film. In case of a Bi thin film not greater than several μm, characteristics thereof are sensitively varied according to a size of grain and crystalline structure. When a carrier moves in the Bi, because OMR effect is varied according to a scattering degree on a grain boundary surface, it is preferable to have a polycrystalline structure of a greater grain or a single-crystalline structure. A x-ray diffraction pattern before heat processing is a typical polycrystalline. On the other hand, in a x-ray pattern after performing heat processing for 8 hours at 268° C. (003), (006) and (009), peak is greatly increased. The peak increase means a single-crystal growth is proceeded. Accordingly, through the heat processing at a temperature adjacent to the melting point, it is analyzed variation from the polycrystalline to the single-crystal occurs.

Figure 3:
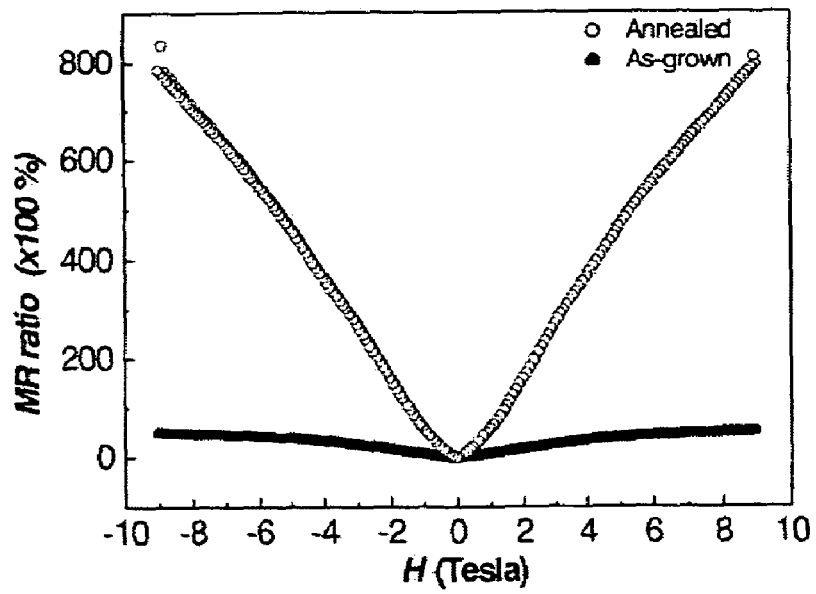
FIG. 3 is a graph showing variation of magnetoresistance before/after heat processing measured at 4 K while a magnetic field is perpendicularly applied to a Bi thin film fabricated by an electrodepositing method.

FIG. 3 is a graph showing variation of magnetoresistance before/after heat processing measured at 4 K while a magnetic field is perpendicularly applied to a Bi thin film fabricated by electrodepositing. In FIG. 3, positive MR having a quasi-liner shape according to the applied magnetic field is shown. In case of a test sample before heat processing, when a magnetic field up to 9T is applied, a magnetoresistnace ratio of 5,200% shows. In case of a test sample after heat processing, a maximum magnetoresistnace ratio of 80,000% shows.

Herein, a magnetoresistance ratio can be calculated as following.

$$MR \text{ ratio}(\%) = \{R(H) - R(0)\} / R(0) \times 100$$

Herein, R(H) is magnetoresistance in magnetic field apply, and R(0) is magnetoresistance in magnetic field non-apply.

It is regarded great improvement of magnetoresistance characteristics after heat processing is caused by variation of a crystalline structure through heat processing. Because a measuring temperature is very low as 4 K, there is almost no heat energy transmitted from the outside, and accordingly a difference of magnetoresistance is mainly caused by a difference of dispersion phenomenon on the grain boundary surface. In more detail, the test sample before heat processing has a magnetoresistance lower than that of the test sample passing the heat processing. In other words, because the test sample before heat processing has the polycrystalline structure, dispersion occurs greatly on the grain boundary surface, and accoridngly spins in the Bi can not be sufficiently arranged in the same direction according to an external magnetic field. On the contrary, after passing the heat processing, grain growth occurs, dispersion phenomenon on the grain boundary surface is remarkably reduced, and accordingly a magnetoresistnace effect is increased.

Figure 4:
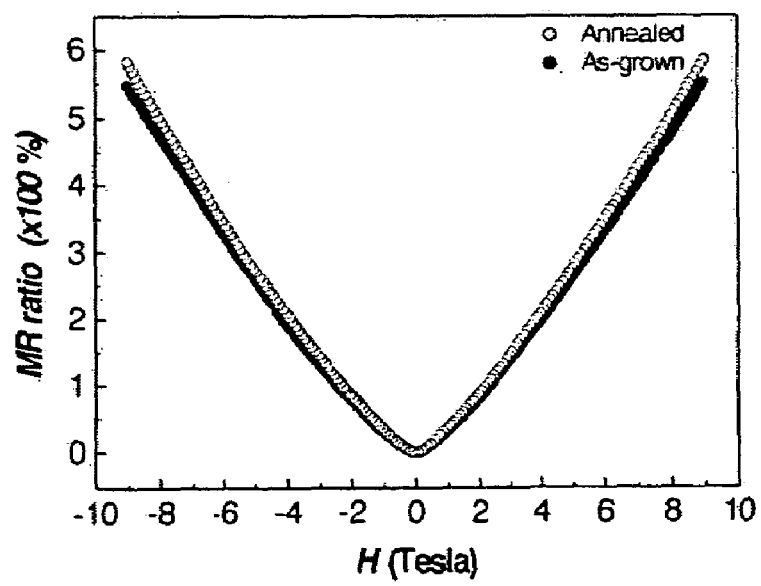
FIG. 4 is a graph showing variation of magnetoresistance before/after heat processing measured at room temperature while a magnetic field is perpendicularly applied to a Bi thin film fabricated by an electrodepositing method.

FIG. 4 is a graph showing variation of magnetoresistance before/after heat processing measured at room temperature while a magnetic field is perpendicularly applied to a Bi thin film fabricated by electrodepositing. Before heat processing, the test sample shows a maximum magnetoresistance ratio of 560% (H=9 T), after the heat processing, the test sample shows a magnetoresistance ratio of 590%. A MR ratio at room temperature is greatly different from that measured at 4 K. Unlike that measured at 4 K, a difference of MR ratio between before/after the heat processing is remarkably reduced. According to the result, it can be known there is another factor affecting a MR effect of the Bi thin film at room temperature, unlike the boundary surface dispersion of the crystalline structure in measuring at 4 K, mean free path of electron is greatly reduced by lattice vibration due to received heat energy. Although MR effect is greatly reduced in comparison with that occurred in a low temperature region, a MR ratio at room temperature is 590%, and accordingly it is better than the conventional GRM effect and application possibility as a device is very bright.

Figure 5:
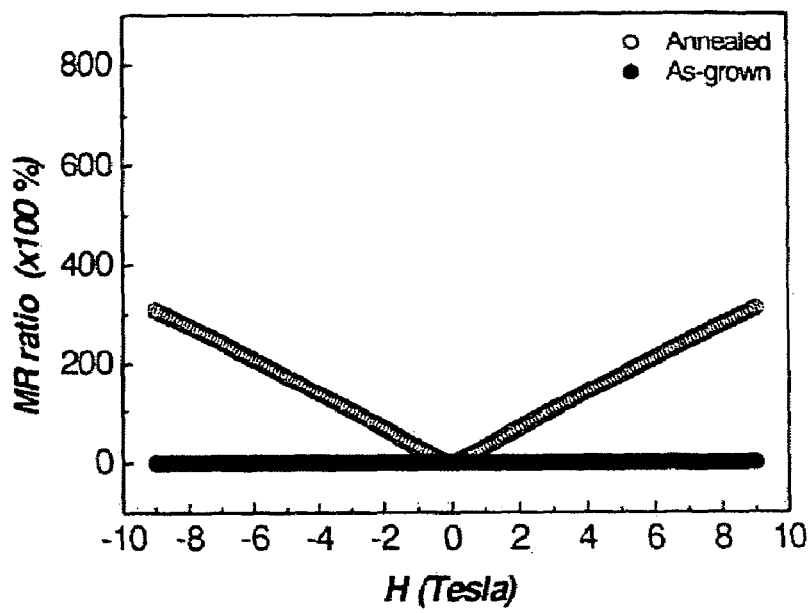
FIG. 5 is a graph showing variation of magnetoresistance before/after heat processing measured at 4 K while a magnetic field is perpendicularly applied to a Bi thin film fabricated by a sputtering method.

FIG. 5 illustrates variation of MR (magnetoresistance) measured at 4 K before/after the heat processing while a magnetic field is perpendicularly applied to a Bi thin film fabricated by a sputtering method. Alike a test sample fabricated by electrodepositing, before the heat processing, very little MR effect occurs. After the heat processing, a MR ratio of the test sample is approximately 30,000% (H=9T), it is greatly improved in comparison with that before the heat processing, however, it is less than that of the Bi thin film fabricated by electrodepositing. The Bi thin film deposited by the sputtering method has an amorphous or a nano-crystalline structure. Because of that, mean free path of the carrier in the thin film is remarkably reduced, and accordingly insignificant MR effect shows. The grain growth is proceeded through the heat processing, however, a size of grain is smaller than that of the electrodepositing method, and accordingly relatively lower MR effect shows.

Figure 6:
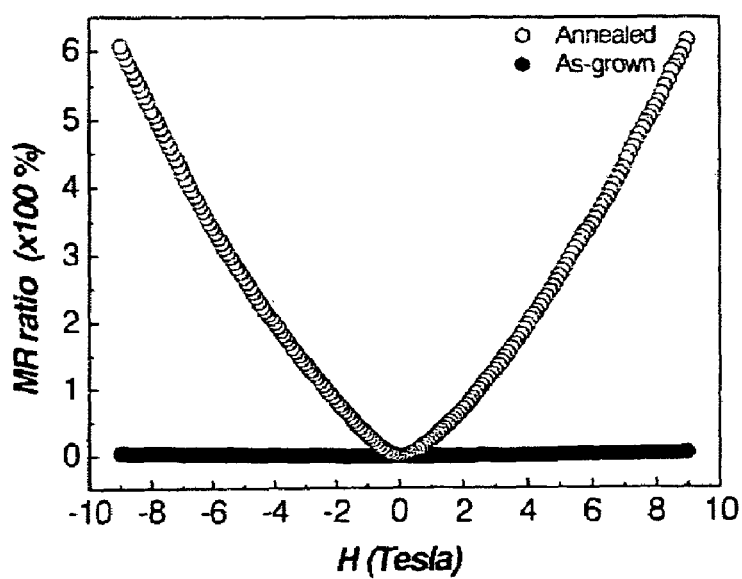
FIG. 6 is a graph showing variation of magnetoresistance before/after heat processing measured at room temperature while a magnetic field is perpendicularly applied to a Bi thin film fabricated by a sputtering method.

FIG. 6 shows variation of MR measured at room temperature before/after the heat processing while a magnetic field is applied perpendicularly to a Bi thin film fabricated by the sputtering method. Unlike the Bi thin film fabircated by the electrodepositing method, difference of a MR ratio before/after the heat processing is significant. In case of a test sample fabricated by the sputtering method, a crystalline structure of the test sample is an amorphous or a nano-crystalloid, dispersion by an inflow of heat energy is much greater than grain boundary dispersion by a crystalline structure. Accordingly, same with the test result in which the test sample before the heat processing is measured at 4 K, a MR effect almost never show. On the contrary, after the heat processing, a MR ratio is maximum 600% (H=9T), and accordingly MR very similar to that of the test sample fabricated by the electrodepositing method shows. Therefore, it is possible to fabricate a Bi thin film having good characteristics by using the sputtering method, and it is very favorable to performing of following device processes such as fine-patterning, etc.

Figure 7:
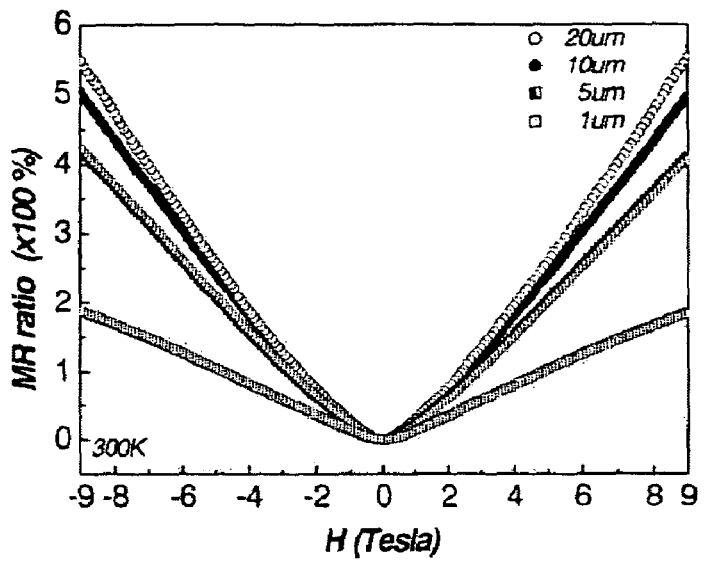
FIG. 7 is a graph showing variation of magnetoresistance according to thickness of a Bi thin film fabricated by an electrodepositing method.

FIG. 7 shows variation of MR according to thickness of a Bi thin film fabricated by the electrodepositing method. MR respectively shows as 200%, 420%, 500% and 560% in an applied magnetic field of maximum 9T. The greater the thickness of the Bi thin film, the greater a MR effect occurs. It means there is close correlation between a MR effect and a mean free path. In more detail, the greater the thickness of the thin film, the longer the mean free path, and accordingly a MR effect is increased. Accordingly, it can be known a MR effect of a Bi thin film is affected by a thickness thereof together with a crystalline structure.

Figure 8:
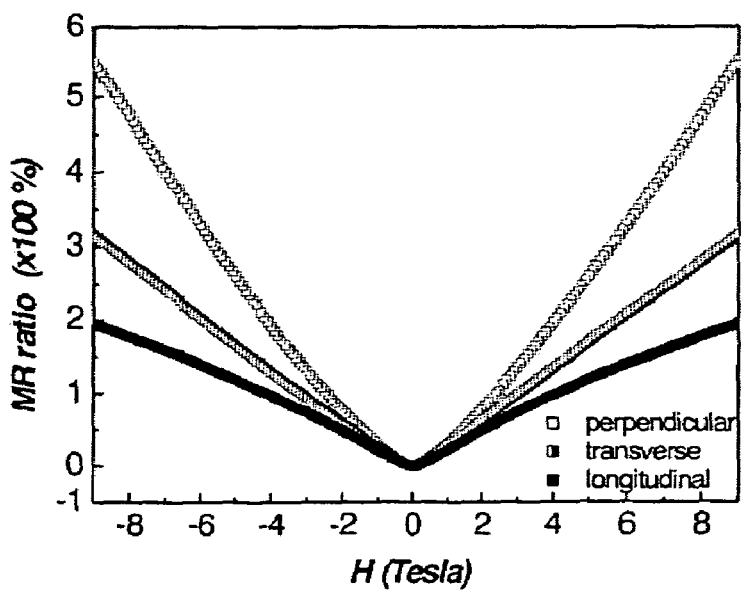
FIG. 8 is a graph showing variation of magnetoresistance of a Bi thin film having thickness of 20 μm fabricated by an electrodepositing method while external electric field is perpendicularly, transversely and longitudinally applied respectively.

FIG. 8 is a graph showing variation of magnetoresistance of a Bi thin film having thickness of 20 μm fabricated by electrodepositing while external electric field is perpendicularly, transversely and longitudinally applied respectively. Mr of Bi is related to geometric factors (perpendicular, transverse, longitudinal) in measuring. MR effect shown in Bi is an OMR phenomenon, it occurs by being affected by Lorentz force occurred while carrier is moved in a magnetic field. Accordingly, magnetic density (B) is in the same direction with current by applying a magnetic field longitudinally, Lorentz force contributed to MR is minimum, it can not affect movement of the carrier not very much. On the contrary, when the magnetic field direction is perpendicular to current, Lorentz force can be maximum, in applying of magnetic field to current longitudinally, minimum MR shows, in applying of magnetic field to current perpendicularly, maximum MR shows.

Magnetic semiconductor in accordance with the present invention can be applied to various devices.

Figure 9:
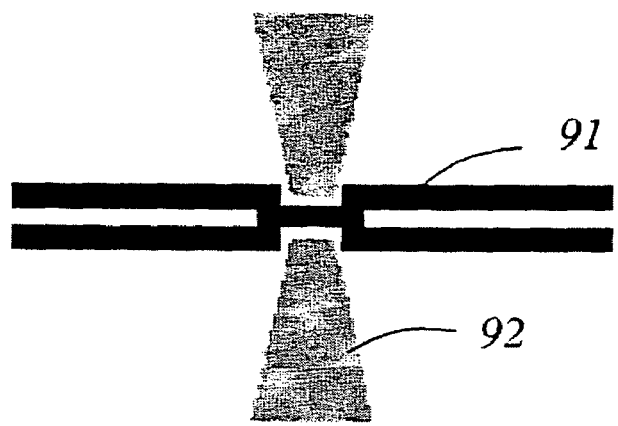
FIG. 9 is a sectional view illustrating a structure of a magnetic field sensor using a Bi thin film fabricated by an electrodepositing method and a sputtering method in accordance with the present invention.

FIG. 9 shows an example of a magnetic sensor using a Bi thin film fabricated by the electrodepositing method and the sputtering method. A magnetically soft substance having great saturation magnetization and permeability as a flux concentrator 91 is adhered to both ends of a Bi 92 in order to concentrate external magnetic field to the Bi. Accordingly, it can be used as a magnetic field sensor sensing small magnetic field.

In addition, by using a Bi thin film in accordance with the present invention, a magnetic field semiconductor is fabricated.

Figure 10:
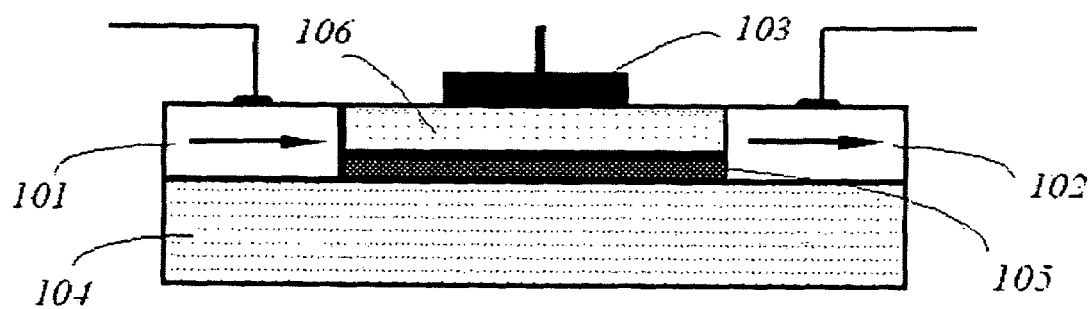
FIG. 10 is a sectional view illustrating a structure of a spin FET (spin-polarized field effect transistor) using a Bi thin film fabricated by an electrodepositing method and a sputtering method.

As depicted in FIG. 10, by forming a source 101 in which spin is injected and detected and a drain 102, injecting spin-polarized carrier into a Bi channel region 105 having a long mean free path and using variation of resistance according to external magnetic field or controlling precession of the spin-polarized carrier with a voltage of the gate 103, it can be applied to a spin FET (spin-polarized field effect transistor). Reference numerals 104 and 106 respectively indicate a substrate and an insulating layer.

As described-above, in the present invention, unlike the conventional MR substances, namely, AMR, GMR and CMR substances, it is possible to fabricate a Bi thin film having very great MR characteristics at room temperature by the electrodepositing method and the sputtering method, and it can be applied to various spintronics devices such as a magnetic field sensor and a spin FET, etc.

What is claimed is:

1. A magnetic field sensor comprising: a Bi-containing thin film as a mesa and a magnetic substance at both sides of the mesa as a flux concentrator, wherein the Bi-containing thin film has a MR ratio of approximately 600% or more at room temperature and not less than 30,000% at 4K when a magnetic filed of 9 T is applied.

2. The magnetic field sensor of claim 1, wherein the mesa produced by photolithography or electron beam lithography.

3. A spin FET (spin-polarized field effect transistor), comprising:
a gate;
an insulating layer on a portion of the gate;
a source/drain region at a side of the insulating layer; and
a spin channel comprising a Bi-containing film,
wherein the Bi-containing thin film has an MR ratio approximately 600% or more at room temperature and not less than 30,000% at 4 K when a magnetic field of 9 T is applied.

4. The spin FET of claim 3, wherein the source/drain region is formed at a left or right side of the insulating layer by using magnetic metal or a magnetic semiconductor having great spin polarization.

5. A spin FET (spin-polarized field effect transistor), comprising:
a gate;
an insulating layer on a portion of the gate;
a source/drain region at a side of the insulating layer; and
a spin channel comprising the Bi-containing film fabricated according to claim 7.

6. The spin FET of claim 5, wherein the source/drain region is formed at a left or right side of the insulating layer by using magnetic metal or a magnetic semiconductor having great spin polarization.

7. A method for fabricating a Bi-containing film, comprising: forming the Bi-containing film onto a substrate at a deposition rate of 0.1–10 µm/min by sputtering in a vacuum chamber, and
heat processing the Bi-containing thin film at a temperature within a range of 250–270° C.

8. The method of claim 7, wherein the Bi-containing film has a MR (magnetoresistance) ratio of approximately 600% or more at room temperature and not less than 30,000% at 4 K under a magnetic field of 9 T.

9. A spin memory device, wherein the spin memory device comprises a gate, a Bi-containing spin channel fabricated by the method according to claim 1 on a portion of the gate and a source/drain region at a side of the spin channel, wherein the spin memory device controls resistance by an external magnetic field,
wherein the Bi-containing spin channel has an MR ratio approximately 600% or more at room temperature and not less than 30,000% at 4 K when a magnetic field of 9 T is applied.

10. A magnetic field sensor comprising a mesa and a magnetic substance, wherein a the mesa comprises the Bi-containing film fabricated by the method of claim 7, and a the magnetic substance having a saturation magnetization and a permeability is formed at plurality of sides of the mesa as a flux concentrator.

11. A spin memory device, wherein the spin memory device comprises a gate, a Bi-containing spin channel fabricated by a the method according to claim 7 on a portion of the gate and a source/drain region at a side of the spin channel, wherein the spin memory device controls resistance by an external magnetic field.

12. The spin memory device of claim 9 wherein the source/drain region is formed at a side of the spin channel by using magnetic metal or a magnetic semiconductor having a spin polarization.

13. The spin memory device of claim 11 wherein the source/drain region is formed at a side of the spin channel by using magnetic metal or a magnetic semiconductor having a spin polarization.

14. The magnetic field sensor of claim 10, wherein the mesa produced by photolithography or electron beam lithography.

* * * * *